United States Patent
Fujita (10) Patent No.: US 7,283,008 B2
(45) Date of Patent: *Oct. 16, 2007

(54) OSCILLATOR CIRCUIT WITH TEMPERATURE COMPENSATION FUNCTION

(75) Inventor: Ken Fujita, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/289,269

(22) Filed: Nov. 30, 2005

(65) Prior Publication Data

US 2006/0077015 A1    Apr. 13, 2006

Related U.S. Application Data

(63) Continuation of application No. 10/810,596, filed on Mar. 29, 2004, now Pat. No. 6,980,062.

(30) Foreign Application Priority Data

Mar. 28, 2003 (JP) .............................. 2003-090012
Jan. 26, 2004 (JP) .............................. 2004-017101

(51) Int. Cl.
*H03B 5/04* (2006.01)
*H03B 5/08* (2006.01)
*H03B 5/12* (2006.01)
*H03L 1/02* (2006.01)
*H03L 7/99* (2006.01)

(52) U.S. Cl. ............... 331/176; 331/25; 331/36 C; 331/115; 331/132; 331/177 V (58) Field of Classification Search ............... 331/1 A, 331/10, 18, 25, 36 C, 66, 69, 70, 115, 117 R, 331/117 FE, 117 D, 132, 167, 176, 177 V
See application file for complete search history.

(56) References Cited

U.S. PATENT DOCUMENTS

| 6,853,262 B2 | 2/2005 | Feikas et al. |
| 6,980,062 B2* | 12/2005 | Fujita ........................ 331/176 |
| 2005/0128017 A1* | 6/2005 | Meltzer ..................... 331/176 |
| 2006/0017519 A1* | 1/2006 | Pernia et al ................ 331/185 |

FOREIGN PATENT DOCUMENTS

| JP | 55-104105 | 8/1980 |
| JP | 61-118630 | 6/1986 |
| JP | 2001-352218 | 12/2001 |

OTHER PUBLICATIONS

Japanese Official Notice of Reasons of Rejection dated Jun. 20, 2006.

* cited by examiner

*Primary Examiner*—David Mis
(74) *Attorney, Agent, or Firm*—Nixon Peabody LLP; Donald R. Studebaker (57) ABSTRACT

An oscillator circuit comprising a resonant circuit which includes a negative resistor, an inductor and an oscillation frequency setting capacitor whose capacitance is varied according to a control voltage based on oscillation frequency data and which outputs a signal having an oscillation frequency based on the oscillation frequency data, a temperature detector which outputs temperature compensation data, based on the temperature, and temperature compensating capacitors which are electrically connected to the resonant circuit and which are supplied with the temperature compensation data to change capacitance values thereof based on the temperature compensation data, thereby adjusting the oscillation frequency.

10 Claims, 11 Drawing Sheets

| COMPOSITE CAPACITANCE OF DEVICE CHARACTERISTIC COMPENSATING CAPACITORS | OSCILLATION FREQUENCY (MHz) | AMOUNT OF SHIFT IN OSCILLATION FREQUENCY (MHz) |
|---|---|---|
| 0 | 2354 | -126 |
| 1*Cl | 2369 | -111 |
| 2*Cl | 2384 | -90 |
| 4*Cl | 2415 | -65 |
| 8*Cl | 2480 | 0 |
| 9*Cl | 2497 | 17 |
| 10*Cl | 2514 | 34 |
| 12*Cl | 2540 | 69 |

Fig. 10

| COMPOSITE CAPACITANCE VALUE(*C1) | TRIAL VALUE (INITIAL VALUE) | RESPONSE | TRIAL VALUE (SECOND TIME) | RESPONSE | TRIAL VALUE (THIRD TIME) | RESPONSE | TRIAL VALUE (FOURTH TIME) | RESPONSE | FINAL VALUE |
|---|---|---|---|---|---|---|---|---|---|
| 0 | (1000) | 0 | (0100) | 0 | (0010) | 0 | (0001) | 0 | (0000) |
| 2 | (1000) | 0 | (0100) | 0 | (0010) | 0 | (0001) | 1 | (0001) |
| 3 | (1000) | 0 | (0100) | 0 | (0010) | 1 | (0011) | 0 | (0010) |
| 4 | (1000) | 0 | (0100) | 0 | (0001) | 1 | (0011) | 1 | (0011) |
| 5 | (1000) | 0 | (0100) | 1 | (0010) | 0 | (0101) | 0 | (0100) |
| 6 | (1000) | 0 | (0100) | 1 | (0110) | 1 | (0101) | 1 | (0101) |
| 7 | (1000) | 0 | (0100) | 1 | (0110) | 0 | (0111) | 0 | (0110) |
| 8 | (1000) | 0 | (0100) | 1 | (0110) | 1 | (0111) | 1 | (0111) |
| 9 | (1000) | 1 | (1100) | 0 | (1010) | 0 | (1001) | 0 | (1000) |
| 10 | (1000) | 1 | (1100) | 0 | (1010) | 0 | (1001) | 1 | (1001) |
| 11 | (1000) | 1 | (1100) | 0 | (1010) | 1 | (1011) | 0 | (1010) |
| 12 | (1000) | 1 | (1100) | 0 | (1010) | 1 | (1011) | 1 | (1011) |
| 13 | (1000) | 1 | (1100) | 1 | (1110) | 0 | (1101) | 0 | (1100) |
| 14 | (1000) | 1 | (1100) | 1 | (1110) | 0 | (1101) | 1 | (1101) |
| 15 | (1000) | 1 | (1100) | 1 | (1110) | 1 | (1111) | 0 | (1110) |
| 16 | (1000) | 1 | (1100) | 1 | (1110) | 1 | (1111) | 1 | (1111) |

OSCILLATOR CIRCUIT WITH TEMPERATURE COMPENSATION FUNCTION

This application is a continuation application of U.S. Ser. No. 10/810,596, filed Mar. 29, 2004, now U.S. Pat. No. 6,980,062, issued Dec. 27, 2005.

BACKGROUND OF THE INVENTION

The present invention relates to an oscillator circuit and a control method thereof, and particularly to an oscillator circuit driven at a low voltage and a control method thereof.

A high-frequency oscillator circuit is configured of, for example, a resonant circuit in which a negative resistor, an inductor and a variable capacitance type capacitor are parallel-connected to one another. A method of controlling the oscillation frequency of such an oscillator circuit is carried out by changing the capacitance of the capacitor with a voltage or changing the mutual conductance of the negative resistor with current as described in the following non-patent document 1, for example. A field effect transistor is generally used as the variable capacitance type capacitor. Described specifically, a gate electrode of the field effect transistor is connected to the negative resistor and the inductor, and a source electrode and a drain electrode thereof are short-circuited to apply 0 to a power supply voltage. The oscillation frequency of the oscillator circuit is changed to 0% to 20% by such a variable capacitance. An oscillation frequency band necessary for radio, a shift in oscillation frequency due to a change in temperature, a shift in oscillation frequency due to variations in device characteristic, etc. are all held within this frequency range.

IEEE Transactions on Microwave Theory and Techniques, Vol. 49, NO. 1, JANUARY 2001, pp 17-22

In the description of the above patent document, the frequency band necessary for radio can be ensured even if an ambient temperature of the oscillator circuit is varied in a range of 240K to 400K where the power supply voltage for driving the oscillator circuit is about 2V or more. When the power supply voltage reaches about 1V, the variable width of the oscillation frequency is reduced to about 5% to about 10%. When the oscillation frequency range of the oscillator circuit becomes narrow, the frequency band necessary for radio cannot be ensured in a temperature range normally required for the oscillator circuit, e.g., a full range of 230K to 400K even though the frequency band necessary for radio could be ensured at a specific temperature. Its principal cause results from the fact that the mutual conductance of each transistor constituting the negative resistor is reduced with a rise in temperature, so that the frequency for starting oscillations is lowered. That is, the oscillator circuit or a voltage-controlled oscillator becomes narrow in oscillation frequency band when its drive voltage is reduced, and cannot afford to accommodate variations in oscillation frequency due to a change in temperature in terms of the frequency. Further, when the variations in production device characteristic are taken into consideration, the accommodation of the variations in device characteristic in the narrow oscillation frequency band at the time that the power supply voltage is about 1V is considered to be almost impossible.

SUMMARY OF THE INVENTION

The present invention has been made to solve the foregoing problems. Therefore, the present invention provides an oscillator circuit, comprising:

a resonant circuit which includes a negative resistor, an inductor and an oscillation frequency setting capacitor whose capacitance is varied according to a control voltage based on oscillation frequency data and which outputs a signal having an oscillation frequency based on the oscillation frequency data;

a temperature detector which outputs temperature compensation data, based on the temperature; and temperature compensating capacitors that are electrically connected to the resonant circuit and changed in capacitance value, based on the temperature compensation data to thereby adjust the oscillation frequency.

In the oscillator circuit according to the present invention, the temperature compensation data based on the temperature of the oscillator circuit is generated by the temperature detector during the operation of the oscillator circuit. Further, the capacitances of the temperature compensating capacitors are adjusted to adjust the capacitance value of the resonant circuit, whereby temperature-compensation for an oscillation frequency range of the oscillator circuit is carried out. According to the oscillator circuit having such a configuration, even if a drive voltage is low and the oscillation frequency is narrow in variable width, the influence of the temperature on the oscillation frequency can be compensated and a required oscillation frequency band can be ensured.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 5 (a) and 5(b) are timing charts for describing a packet transmitting/receiving process according to the first embodiment;

DETAILED DESCRIPTION OF THE INVENTION

Preferred embodiments of the present invention will hereinafter be described in detail with reference to the accompanying drawings.

FIRST EMBODIMENT

[Overall Configuration]

Figure 1:
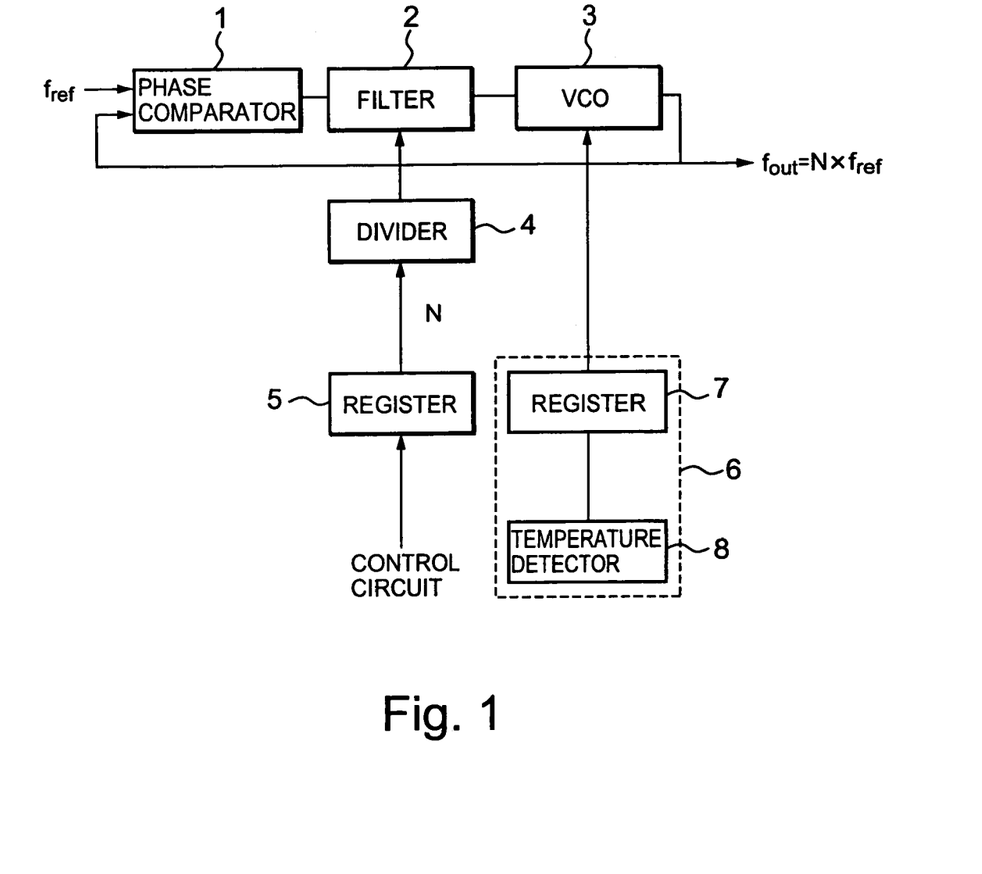
FIG. 1 is a configurational example of an oscillator circuit according to a first embodiment of the present invention.

FIG. 1 is a configurational example of an oscillator circuit 100 according to a first embodiment. The oscillator circuit 100 is contained in a wireless integrated circuit mounted in a wireless apparatus such as a wireless local area network (LAN) and determines a carrier frequency of a radio wave in accordance with the oscillation frequency of an output signal of the oscillator circuit 100.

The oscillator circuit 100 is a phase locked loop type oscillator circuit, for example. As will be described later, the oscillator circuit 100 has a temperature compensating function for compensating for the influence of a change in the temperature of the oscillator circuit 100 on an oscillation frequency band.

The oscillator circuit 100 includes a phase locked loop comprising a phase comparator 1, a loop filter 2, a voltage-controlled oscillator (VCO) 3 and a frequency divider 4, a register 5 and a temperature compensating circuit 6.

The phase comparator 1 outputs the difference in phase between a reference frequency signal having a reference frequency fref and a frequency division signal corresponding to the output of the divider 4 in voltage or current form. The loop filter 2 is a low pass filter (LPF), which effects smoothing (averaging) on the output of the phase comparator 1. Since the voltage outputted from the loop filter 2 is equivalent to the output of the LPF here, the output voltage of the loop filter 2 will be called "LPF voltage" in the following description. The voltage-controlled oscillator 3 outputs an oscillation frequency signal fout having a frequency (N*fref) equivalent to division ratio N times the reference frequency fref in accordance with the LPF voltage. The divider 4 is configured of, for example, a programmable counter, which divides the frequency of the oscillation frequency signal fout into 1/N. The register 5 sets frequency data (division ratio N) to the divider 4 and outputs temperature compensation data to the voltage-controlled oscillator 3 in order to adjust the oscillation frequency band. The temperature compensation data is data for compensating for the influence of the temperature of the oscillator circuit 100 on the oscillation frequency band.

The register 5 (frequency data setting unit) obtains or captures and retains frequency data (division ratio N) fetched from a control circuit of the wireless apparatus and sets it to the divider 4.

The temperature compensating circuit 6 comprises a register 7 (temperature compensation data setting unit) and a temperature detector 8. The temperature detector 8 outputs temperature compensation data corresponding to the temperature to the register 7. The register 7 temporarily holds the temperature compensation data therein and sets it to the voltage-controlled oscillator 3. As will be described later, the register 7 renews or updates the incoming temperature compensation data for each transmission or reception of a packet from or in the wireless apparatus, sets it to the voltage-controlled oscillator 3 and holds the same value during the transmission or reception of one packet.

The oscillator circuit 100 feeds back the division signal obtained by dividing the output of the voltage-controlled oscillator 3 into 1/N by the divider 4 to the phase comparator 1 and performs feedback control in such a manner that the reference frequency signal and the division signal coincide in phase with each other, thereby outputting the oscillation frequency fout equivalent to N times the reference frequency fref. The setting of the oscillation frequency is carried out by causing the register 5 to set the division ratio N to the divider 4. If the value of the division ratio N is changed, then the oscillation frequency is changed. The temperature compensating circuit 6 compensates for the influence of the temperature on the oscillation frequency.

[Configuration of Voltage-controlled Oscillator]

Figure 2:
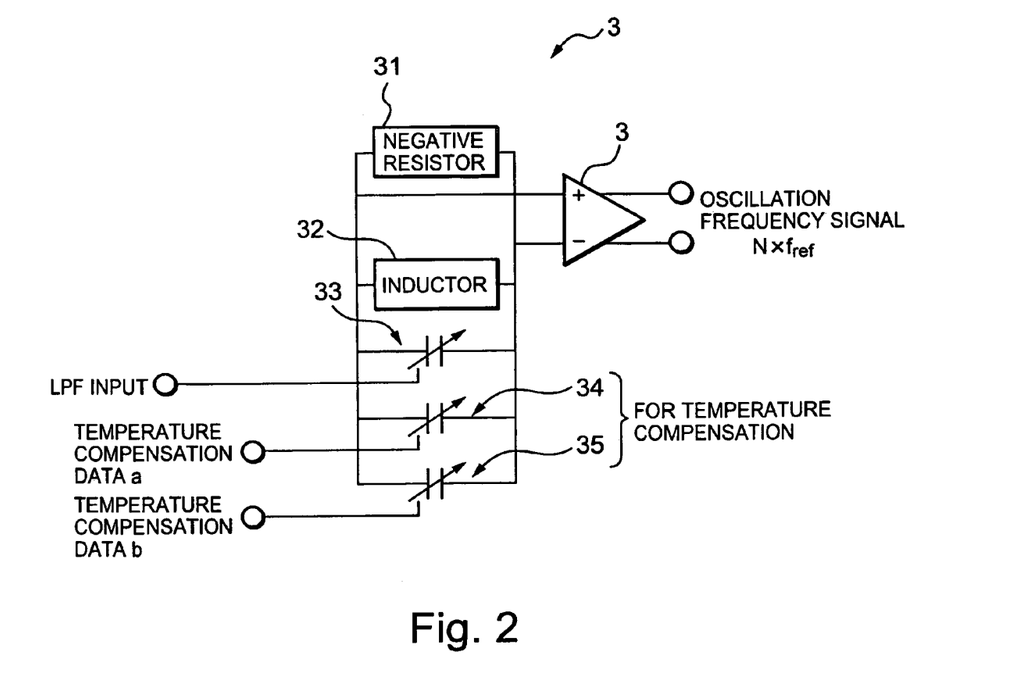
FIG. 2 is a configurational example of a voltage-controlled oscillator according to the first embodiment.

FIG. 2 is a configurational example of the voltage-controlled oscillator 3. The voltage-controlled oscillator 3 includes a negative resistor 31, an inductor 32, an oscillation frequency setting capacitor 33 and a buffering circuit 36. The negative resistor 31, the inductor 32 and the capacitor 33 constitute a resonant circuit. The negative resistor 31 comprises, for example, a plurality of transistors that constitute a positive feedback loop. Here, the capacitor 33 is a variable capacitance type capacitor and has a voltage control terminal for varying a capacitance value. The LPF voltage corresponding to the output of the loop filter 2 is inputted to the voltage control terminal of the capacitor 33. The capacitance of the capacitor 33 is varied according to the LPF voltage. The buffering circuit 36 is a buffer circuit for preventing buffering between the resonant circuit and a circuit on the output side. The buffer circuit fetches out a signal oscillated by the resonant circuit and outputs an oscillation frequency signal.

In the present embodiment, the inductance of the inductor 32 is set to, for example, 2.0 nH, the capacitance value of the capacitor 33 is set to 2.1 pF as a typical value, and the oscillation frequency band is set to a range of 2.4 GHz to 2.5 GHz.

The voltage-controlled oscillator 3 further includes temperature compensating capacitors 34 and 35. The temperature compensating capacitors 34 and 35 are variable capacitance type capacitors for compensating for the influence of a change in temperature on the oscillation frequency band. The capacitors 34 and 35 respectively have voltage control terminals for varying their capacitance value. Temperature compensation data a and b are respectively inputted to the voltage control terminals from the temperature compensating circuit 6 (see FIG. 1). The capacitors 34 and 35 are varied in capacitance value in accordance with the temperature compensation data a and b. The capacitance values of the temperature compensating capacitors 34 and 35 are respectively set to $1/16$ of the capacitance value of the oscillation frequency setting capacitor 33.

Although the temperature compensating capacitor is provided two (corresponding to the two voltage control terminals inputted with the temperature compensation data), the number of the temperature compensating capacitors (corresponding to the number of the voltage control terminals inputted with the temperature compensation data) may be three or more. However, the number of the temperature compensating capacitors has an upper limit and is selected in a range less than its upper limit value. This is because the value of stray capacitance existent in wiring or the like of each temperature compensating capacitor becomes innegligible for the capacitance value of the oscillation frequency setting capacitor 33 with an increase in the capacitance values of the temperature compensating capacitors parallel-connected to the resonant circuit. Thus, the number of the temperature compensating capacitors reaches the upper limit value when the oscillation frequency of the oscillator circuit 100 is controlled by the stray capacitance.

[Configuration of Temperature Detector]

Figure 3A:
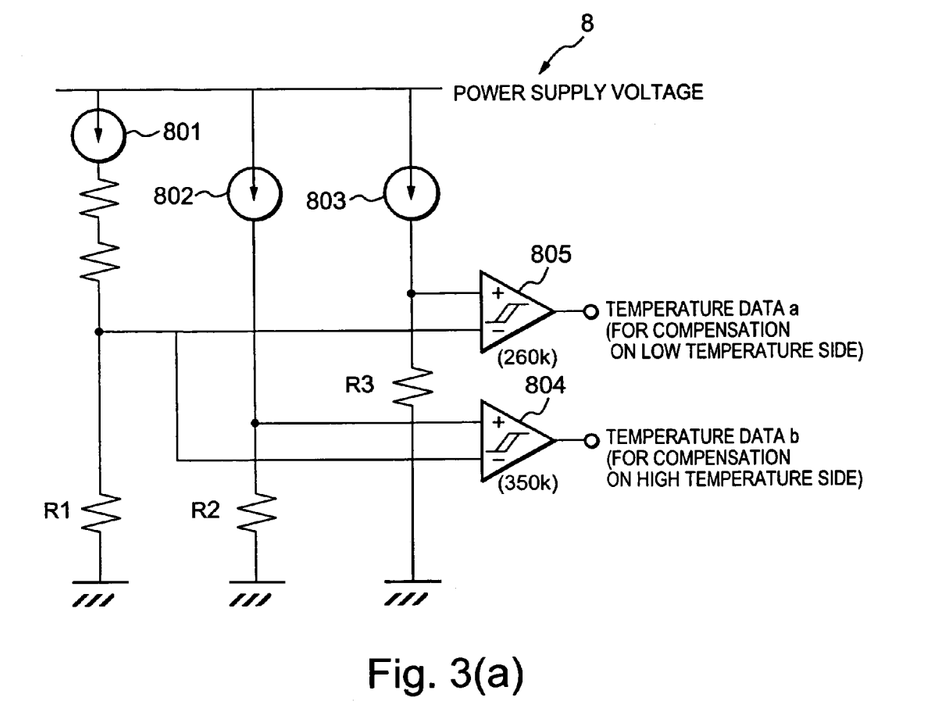
FIG. 3(a) shows a circuit configuration of a temperature detector of the temperature detector.

FIG. 3(*a*) is a configurational example of the temperature detector 8. The temperature detector 8 includes current sources 801 through 803, resistors R1 through R3 and voltage comparators 804 and 805.

The current source 801 is a current source independent on the temperature, i.e., a current source that outputs a predetermined current without depending on the temperature. The resistor R1 is connected in series with the current source 801 with resistors interposed therebetween as needed. A voltage applied across the resistor R1 is outputted to the voltage comparators 804 and 805. The voltage applied across the resistor R1 is calculated based on the product of the resistance value of the resistor R1 and the output current of the current source 81. Since the output current does not depend on the temperature, the voltage applied across the resistor R1 does not depend on the temperature either. The voltage applied across the resistor R1 reaches 50 kΩ*20 μA=1V assuming that, for example, the resistance value of the resistor R1 is 50 kΩ and the output current of the current source 801 is 20 μA.

The current sources 802 and 803 are current sources each of which outputs a current proportional to the absolute temperature. The resistors R2 and R3 are connected in series with the current sources 802 and 803 respectively.

A voltage applied across the resistor R2 is inputted to the voltage comparator 804. The voltage applied across the resistor R2 is equivalent to the product of the resistance value of the resistor R2 and the output current of the current source 802. Since the output current is proportional to the absolute temperature, the voltage applied across the resistor R2 is also proportional to the absolute temperature. The resistor R2 is selected in such a manner that the voltage applied across the resistor R2 becomes equal to the voltage (1V in the present embodiment) applied across the resistor R1 at a temperature 350K. The voltage applied across the resistor R2 is calculated as 42857 Ω*20 μA (absolute temperature/300K) assuming that, for example, the resistance value of the resistor R2 is 42857Ω and the output current of the current source 802 is 20 μA* (absolute temperature/300K).

A voltage applied across the resistor R3 is inputted to the voltage comparator 805. The voltage applied across the resistor R3 is equivalent to the product of the resistance value of the resistor R3 and the output current of the current source 803. Since the output current is proportional to the absolute temperature, the voltage applied across the resistor R3 is also proportional to the absolute temperature. The resistor R3 is selected in such a manner that the voltage applied across the resistor R3 becomes equal to the voltage (1V in the present embodiment) applied across the resistor R1 at a temperature 260K. The voltage applied across the resistor R3 is calculated as 57700 Ω*20 μA (absolute temperature/300K) assuming that, for example, the resistance value of the resistor R3 is 57700Ω and the output current of the current source 803 is 20 μA* (absolute temperature/300K).

Figure 3B:
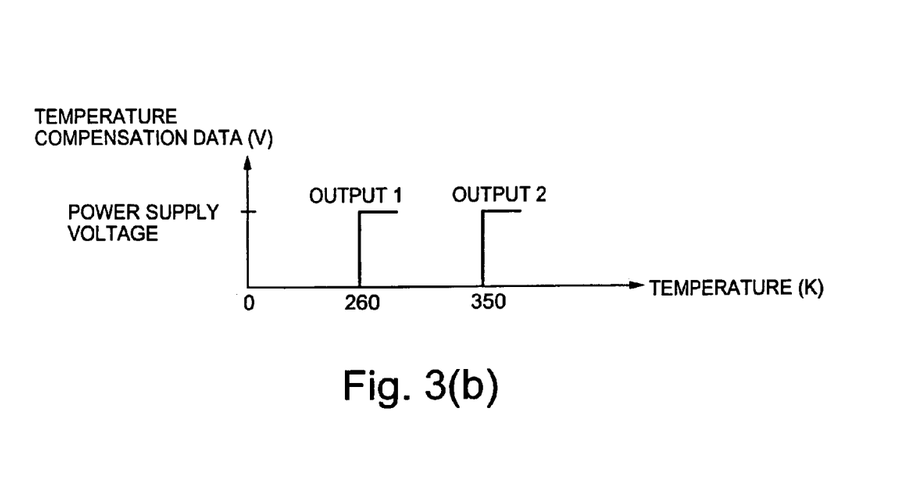
FIG. 3(b) shows an output signal of a temperature detector of the temperature detector.

The voltage comparator 804 outputs temperature compensation data b for decreasing the capacitance value of the capacitor 35 and raising the oscillation frequency band when the temperature rises. In the present embodiment, when the temperature rises beyond 350K (threshold value), the output of the voltage comparator 804 is inverted from low: 0V to high: power supply voltage as shown in FIG. 3(*b*) to thereby reduce the capacitance value of the capacitor 35 by 0.07 pF from the capacitance value where it is low. The voltage comparator 804 has a history (hysteresis) with respect to the input such that when the temperature is lowered and falls below 350K, the temperature compensation data b is inverted from high to low at a temperature lower than 350K.

The voltage comparator 805 outputs temperature compensation data a for increasing the capacitance value of the capacitor 34 and lowering the oscillation frequency band when the temperature rises. In the present embodiment, when the temperature is reduced below 260K (threshold value), the output of the voltage comparator 805 is inverted from high: power supply voltage to low: 0V as shown in FIG. 3(*b*) to thereby increase the capacitance value of the capacitor 34 by 0.01 pF from the capacitance value where it is high. The voltage comparator 805 has a history (hysteresis) with respect to the input such that when the temperature is raised and falls beyond 260K, the temperature compensation data a is inverted from low to high at a temperature higher than 260K.

Here, it is desirable that each of the signals given to the temperature compensating capacitors 34 and 35 is a stable digital signal of either 0V or the power supply voltage. This is because the dependence of the capacitors 34 and 35 on the voltage is almost negligible near 0V and the power supply voltage given to the power supply control terminals of the capacitors 34 and 35, whereas the dependence of the capacitors 34 and 35 on the voltage is finite in value where each of the voltages applied to the power supply control terminals is an intermediate value between those voltages.

Incidentally, although the current sources for outputting the currents proportional to the absolute temperature, and the resistors and voltage comparators connected in series with them are provided in two pairs in FIG. 3(*a*), they may be increased within the range of the upper limit value of the number of the temperature compensating capacitors of the voltage-controlled oscillator 3 as described above. If the temperature detector 8 for outputting four temperature compensation data is configured so as to output the temperature compensation data inverted from low to high at 320K and 350K on the side higher in temperature than 300K and output the temperature compensation data inverted from high to low at 290K and 260K on the side lower in temperature than 300K, for example, then high-accuracy temperature compensation can be realized as compared with the case of the two temperature compensation data.

The current source 801 independent on the temperature is one for generating a reference voltage independent on the temperature may be substituted with a voltage source independent on the temperature.

[Temperature Dependence of Oscillation Frequency]

FIGS. 4(*a*) to 4(*c*) shows results obtained by measuring a relationship between the oscillation frequency and the LPF voltage at respective temperatures (−40° C., 27° C. and 100°

Figure 4A:
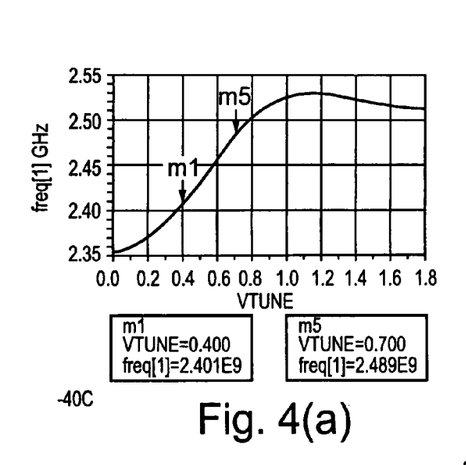
FIGS. 4(a) to 4(c) illustrate results obtained by measuring relationships between oscillation frequencies and LPF voltages at non-temperature compensation under respective temperatures.
Figure 4B:
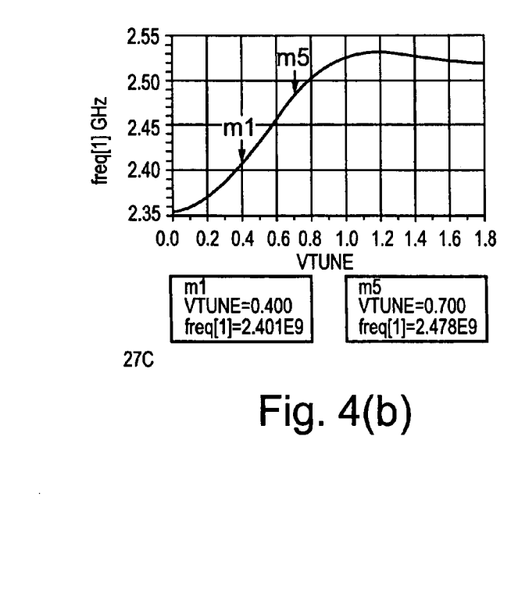
Figure 4C:
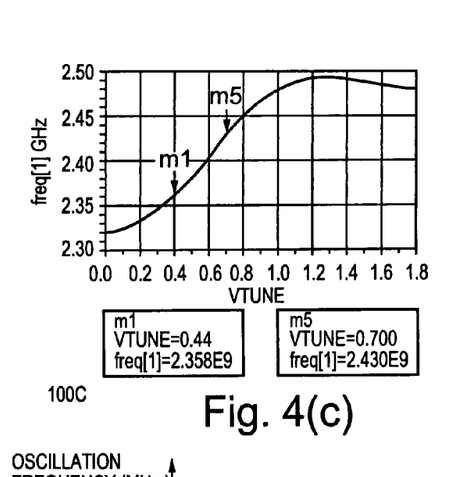
Figure 4D:
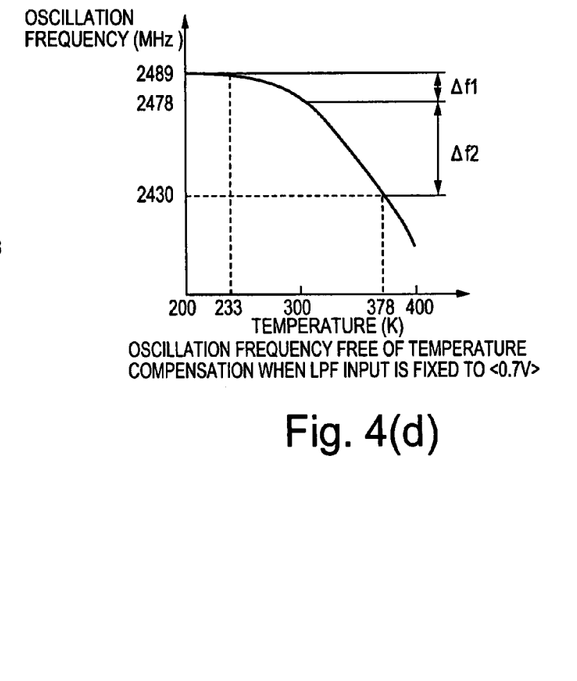
FIG. 4(d) illustrates a relationship between the oscillation frequency and the temperature where the LPF voltage=0.7V in FIGS. 4(a) to 4(c)

C.). FIG. 4(d) illustrates a relationship between the oscillation frequency and the temperature at the LPF voltage 0.7V in FIGS. 4(a) to 4(c).

Referring to FIG. 4(d), the oscillation frequency at 300K (27° C.) is 2478 MHz, whereas the oscillation frequency at 373 (100° C.) is 2430 MHz and the oscillation frequency at 233K (−40° C.) is 2489 MHz. A principal cause of a reduction in the oscillation frequency due to a rise in temperature results from the fact that the carrier mobility of each transistor constituting the negative resistor 31 is reduced to degrade the mutual conductance of the transistor, so that the resistance value of the negative resistor 31 is decreased. In addition, an increase in the value of a series resistance of the inductor 32 and the capacitor 33 with a rise in temperature also contributes to a reduction in oscillation frequency. Due to these two causes, the frequency at which the negative resistance value (negative resistor 31) exceeds the series resistance value (inductance 32 and capacitor 33), is reduced and hence the oscillation frequency is lowered.

In the present embodiment, the oscillation frequency varied with the change in temperature is controlled so as to be maintained at near the design value (2478 MHz (300K)) by virtue of the temperature compensating circuit 6 and the temperature compensating capacitors 34 and 35. Described specifically, when the temperature rises and exceeds 350K as described above, the output of the voltage comparator 804 is inverted from low to high and the temperature compensation data b: high is supplied to the capacitor 35, whereby the capacitance value of the capacitor 35 is reduced so that the oscillation frequency band is raised. As a result, the oscillation frequency at 373K receives compensation to 2478 MHz as a substitute for 2430 MHz.

On the other hand, when the temperature is lowered and falls below 260K, the output of the voltage comparator 805 is inverted from high to low and the temperature compensation data a: low is supplied to the capacitor 34. Thus, the capacitance value of the capacitor 34 is raised so that the oscillation frequency band is lowered. As a result, the oscillation frequency at 230K receives compensation to 2478 MHz as a substitute for 2489 MHz. The dependence of the oscillation frequency on the temperature shown in FIG. 4(d) is suppressed by the changes in the capacitance values of the capacitors 34 and 35 due to these temperature compensation data a and b.

As a result, the oscillation frequency can be controlled to near the oscillation frequency band at 300K in both cases in which the temperature becomes higher and lower than 300K.

[Packet Transmitting/Receiving Process]

Figure 5A:
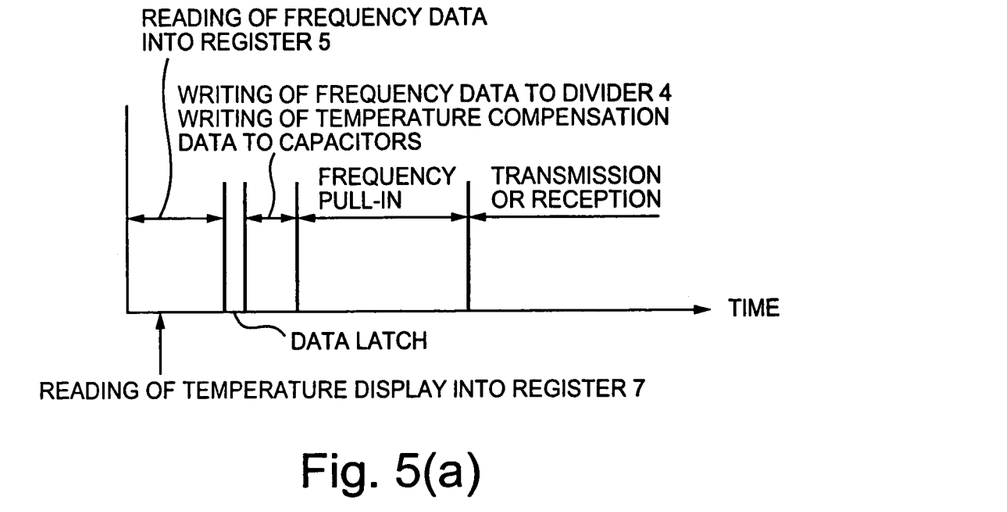
Figure 5B:
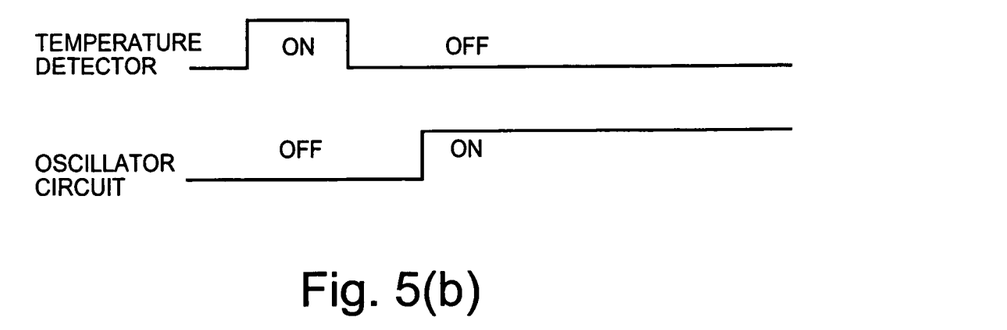

FIGS. 5(a) and 5(b) typically shows a timing chart for describing a packet transmitting/receiving process according to the present embodiment. The same figure is a timing chart showing a process executed for each transmission or reception of one packet.

In a wireless system of a short-range wireless LAN, the transmission/reception of each packet generally takes turns at a time base. A wireless integrated circuit fetches set data (division ratio N) of the following oscillation frequency from a control circuit of a wireless apparatus at the beginning of alternation of the transmission and reception and sends the set data to an oscillation unit (corresponding to the oscillator circuit shown in FIG. 1 in the present embodiment) of the wireless integrated circuit.

Described specifically, the wireless integrated circuit receives oscillation frequency data (division ratio N) and reads it into the register 5 and holds it therein at the beginning of alternation of the transmission and reception as shown in FIG. 5(a). The temperature detector 8 is started (ON) in the same time zone and the temperature compensation data a and b are read from the temperature detector 8 to the register 7, where they are retained therein. Thereafter, the temperature detector 8 is stopped (see the same FIGS. 5(a) and 5(b)). Afterwards, the oscillation frequency data (division ratio N) is written into the divider 4 and the temperature compensation data a and b are respectively set to the capacitors 34 and 35 of the voltage-controlled oscillator 3. After the completion of these settings, the phase locked loop of the oscillator circuit 100 is operated to lock or pull in the frequency until the oscillation frequency is stabilized (see the same FIGS. 5(a) and 5(b)). If the oscillation frequency is made stable, then the transmission or reception of the packet is started (see the same FIGS. 5(a) and 5(b)).

Figure 6:
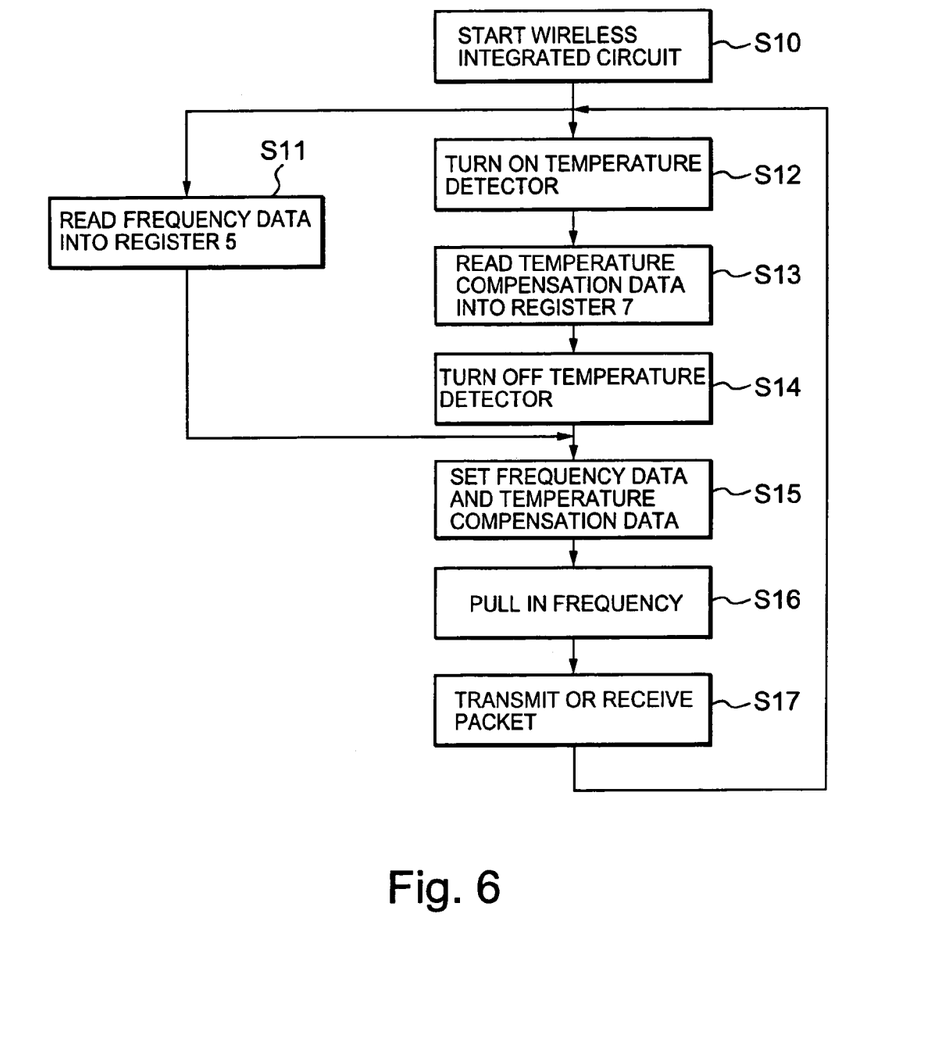
FIG. 6 is a flowchart for describing the packet transmitting/receiving process according to the first embodiment.

FIG. 6 is a flowchart for describing the packet transmitting/receiving process according to the present embodiment.

After the wireless integrated circuit has been started up (Step S10), the oscillation frequency data (division ratio N) is read from the control circuit of the wireless apparatus to the register 5, where it is retained (Step S11). Further, the temperature detector 8 is started up (ON) (Step S12) and the temperature compensation data a and b are read into and retained in the register 7 (Step S13). Thereafter, the temperature detector 8 is turned OFF (stopped).

Next, the oscillation frequency data is written into the divider 4, and the temperature compensation data a and b are respectively set to the capacitors 34 and 35 of the voltage-controlled oscillator 3 (Step S15). After the completion of these settings, the phase locked loop of the oscillator circuit 100 is operated to pull in the frequency until the oscillation frequency is stabilized (Step S16). If the oscillation frequency is stabilized, then the transmission or reception of one packet is executed (Step S17). After the completion of the transmission or reception of one packet, the present process is returned to Steps S11 and S12, and Steps S11 and S12 through S17 are repeated.

The capacitance values of the temperature compensating capacitors 34 and 35 are held constant during the transmission or reception of one packet in this way. Thus, even if the temperature is moved over the threshold values of the voltage comparators 804 and 805 of the temperature detector 8 in the course of the transmission or reception of the packet, the oscillation frequency of the oscillator circuit is held constant.

In the present embodiment, current consumption of the temperature detector 8 depends on the number of the current sources. When the four current sources whose currents are proportional to the absolute temperature, are provided in the temperature detector 8, the current sources of the temperature detector 8 result in 5 in total by summing the four current sources whose currents are proportional to the absolute temperature, and one current source independent on the temperature. In this case, power consumption results in 5*20 µA=100 µA upon operation of the temperature compensating circuit 6. Since, however, the temperature compensating circuit 6 is deactivated up to the head of the following packet after the temperature data a and b have been retained in the register 7, as shown in FIG. 5(b), the power consumption reaches less than 10 µA if averaged inclusive of even the time being used during transmission/reception, and hence an increase in power consumption due to the temperature compensating function is little.

Figure 7:
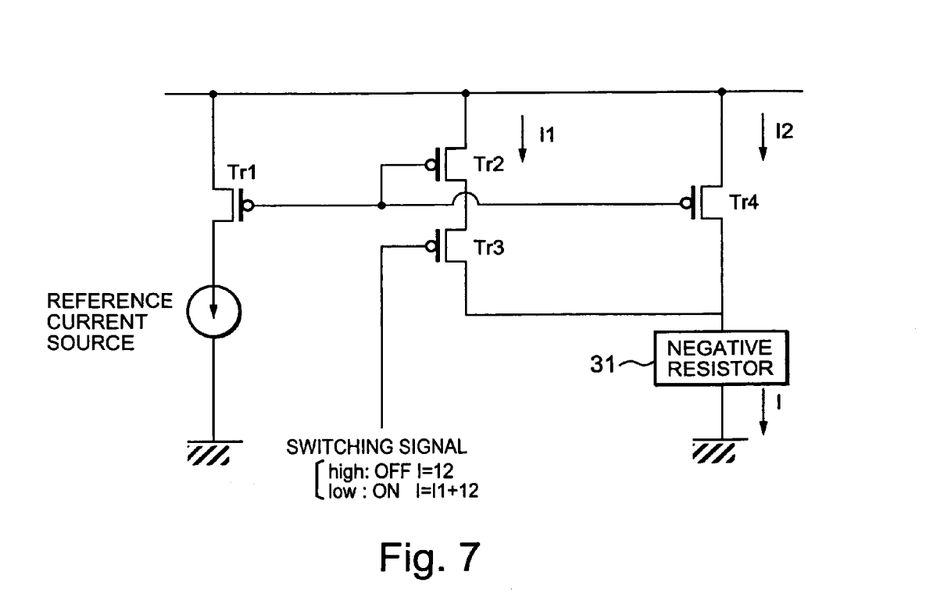
FIG. 7 is a circuit configurational example for varying the mutual conductance of a negative resistor.

In the present embodiment, the temperature data a and b are supplied to the temperature compensating capacitors 34 and 35. However, the temperature compensation data are supplied to the negative resistor 31, and the dc current supplied to each transistor of the negative resistor 31 is changed to vary the mutual conductance thereof, for example, whereby temperature compensation may be effected on the oscillation frequency. Since it is disadvantageous to increase the dc current flowing into the transistor in terms of low power consumption of the wireless integrated circuit, the method of varying the capacitance values of the temperature compensating capacitors 34 and 35 as described above is advantageous. However, when the temperature compensation is effected on the oscillation frequency by varying the mutual conductance of the negative resistor 31, the temperature compensating capacitors 34 and 35 can be omitted. A circuit configurational example for changing the mutual conductance of the negative resistor 31 is shown in FIG. 7. As shown in FIG. 7, a switching signal based on temperature compensation data is supplied to a Tr3 to switch a current I supplied to the negative resistor 31 to I2 alone or I1+I2, thereby making it possible to vary the mutual conductance of the negative resistor 31.

[Operation and Effects]

According to the present embodiment, since the dependence of the oscillation frequency of the oscillator circuit 100 on the temperature is compensated, a burden for ensuring an allowance for a change in temperature with respect to the oscillation frequency band is reduced. That is, it is possible to narrowly design the oscillation frequency band, i.e., design the frequency sensitivity of the oscillator circuit 100 low. As a result, a variation in the oscillation frequency becomes small with respect to noise dependent on the output of the loop filter 2, whereby an oscillation spectrum becomes narrow.

According to the present embodiment as well, since the temperature data a and b are retained in the register 7 for each transmission/reception of the packet and supplied to the temperature compensating capacitors 34 and 35, the oscillation frequency band of the oscillator circuit 100 can almost always be maintained at an oscillation frequency band corresponding to a design value when the oscillator circuit 100 is used for long hours and even if the environmental temperature is changed up to the maximum of its specs (e.g., 230K to 400K).

Further, according to the present embodiment, since the temperature data a and b of the temperature detector 8 are supplied to the temperature compensating capacitors 34 and 35 in the form of digital signals, and the temperature compensating capacitors 34 and 35 are subjected to either 0V or the power supply voltage, i.e., the voltage smallest in capacitance value-input voltage characteristic, the resistance characteristics of the output of the temperature detector 8 to electrical noise are excellent.

Furthermore, according to the present embodiment, since the wireless integrated circuit obtains the temperature data a and b during the reception of the transmit/receive frequency data from the control circuit of the wireless apparatus, the influence of the acquirement of the temperature data a and b on the frequency pull-in time is little.

SECOND EMBODIMENT

Figure 8:
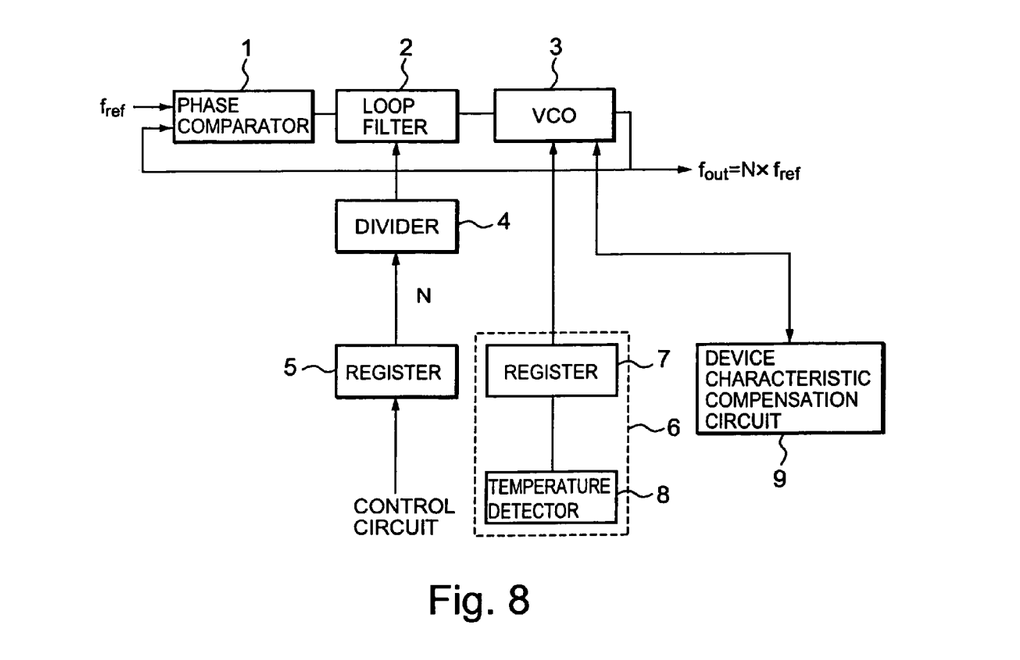
FIG. 8 is a configurational example of an oscillator circuit according to a second embodiment of the present invention.
Figure 9:
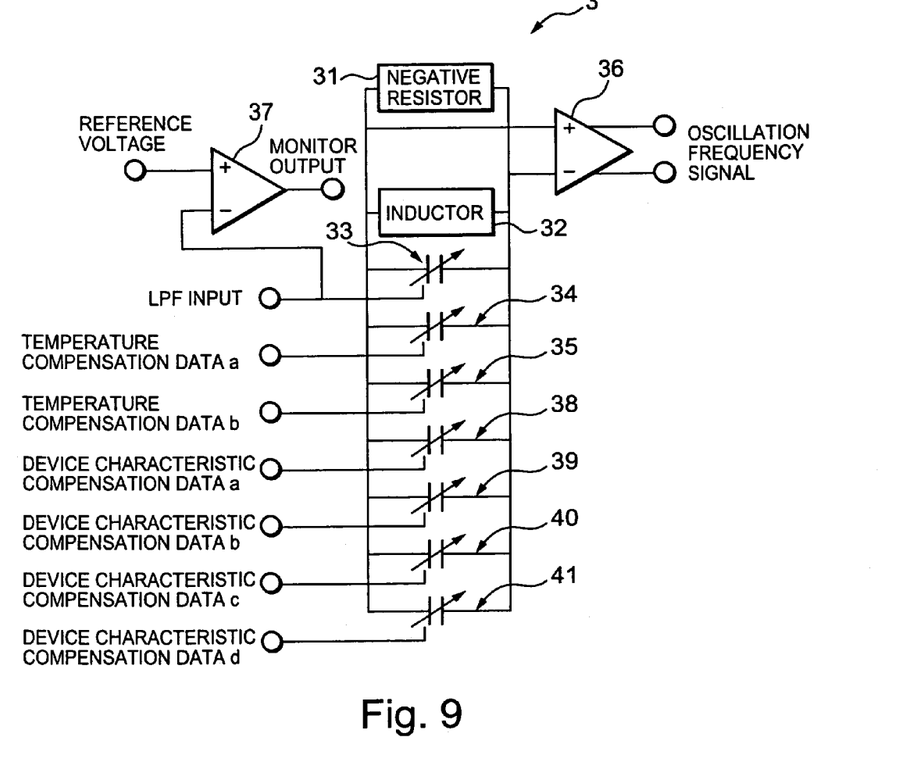
FIG. 9 is a configurational example of a voltage-controlled oscillator according to the second embodiment.

FIG. 8 is a configurational example of an oscillator circuit 100 according to a second embodiment, and FIG. 9 is a configurational example of a voltage-controlled oscillator 3 according to the second embodiment, respectively.

As shown in FIG. 8, the oscillator circuit 100 according to the present embodiment further includes a device characteristic compensating circuit 9 in the oscillator circuit according to the first embodiment. As shown in FIG. 9, the voltage-controlled oscillator 3 according to the present embodiment further includes device characteristic compensating capacitors 38 through 41 and a monitor circuit 37 in the voltage-controlled oscillator according to the first embodiment.

The device characteristic compensating capacitors 38 through 41 are respectively variable capacitances for adjusting a shift in oscillation frequency band due to variations in device characteristic.

The monitor circuit 37 is a circuit for monitoring an LPF voltage. The circuit compares a reference voltage corresponding to a design value of an LPF voltage necessary to output an oscillation frequency set by frequency data (division ratio N) at a desired temperature (300K in the present embodiment) and an actual LPF voltage and outputs the result thereof as a monitor output.

The device characteristic compensating circuit 9 is a circuit for controlling a string of device characteristic compensation data (a, b, c, d) given to the device characteristic compensating capacitors 38 through 41, based on the monitor output and adjusting the capacitance values of the capacitors 38 through 41, thereby compensating for the influence of variations in device characteristic on the oscillation frequency.

The monitor output of the monitor circuit 37 is a digital signal. In the present embodiment, "0" (low: 0V) is outputted when the LPF voltage is less than or equal to the reference voltage, whereas when the LPF voltage is higher than the reference voltage, "1" (high: power supply voltage) is outputted. The monitor output of the monitor 37 has a history (hysteresis) with respect to the input. There is a difference between an LPF voltage at which the monitor output is inverted with an increase in LPF voltage, and an LPF voltage at which the monitor output is inverted with a decrease in LPF voltage.

The capacitance values of the device characteristic compensating capacitors 38 through 41 are values proportional to the power of 2. In the present embodiment, the capacitance values of the device characteristic compensating capacitors 38 through 41 are 0.03 pF, 0.06 pF, 0.12 pF and 0.24 pF respectively. The device characteristic compensating capacitors 38 through 41 respectively receive respective data of the device characteristic compensation signal string (a, b, c, d) corresponding to a digital signal from the device characteristic compensating circuit 9. The capacitance value-input voltage characteristics of the device characteristic compensating capacitors 38 through 41 are set so as to select capacitors in which the dependence of the capacitance values on the voltage becomes almost zero between 0V and the power supply voltage.

Figure 10:
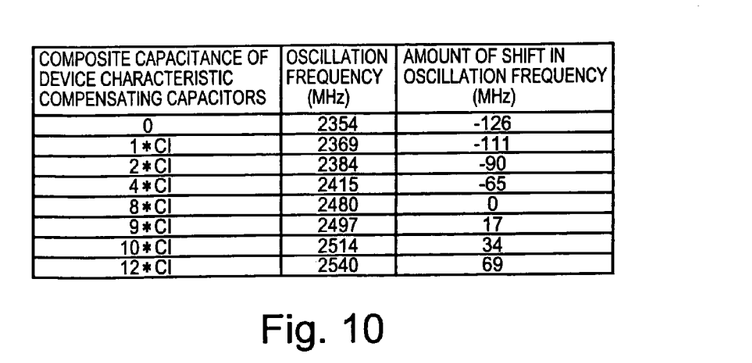
FIG. 10 shows a simulation result obtained by varying the composite capacitance value of device characteristic compensating capacitors to thereby calculate an oscillation frequency.

The oscillation frequency of the oscillator circuit 100 is increased in a range of 15 MHz to 18 MHz each time the composite capacitance value of the device characteristic-compensating capacitors 38 through 41 is reduced by a constant value C1 (e.g., 0.03 pF). Changes in oscillation frequency by simulation are represented as shown in FIG. 10. In the same drawing, the composite capacitance value of the device characteristic-compensating capacitors 38 through 41 is expressed in multiples of C1, and the oscillation frequency corresponds to the oscillation frequency of the oscillator circuit 100 at the each composite capacitance value. The amount of a shift in the oscillation frequency is equivalent to a change in frequency with the oscillation frequency 2460 MHz where the composite capacitance value is 8*C1, as a reference value.

[Capacitance Value Determining Algorithm of Device Characteristic Compensating Process]

Figure 11:
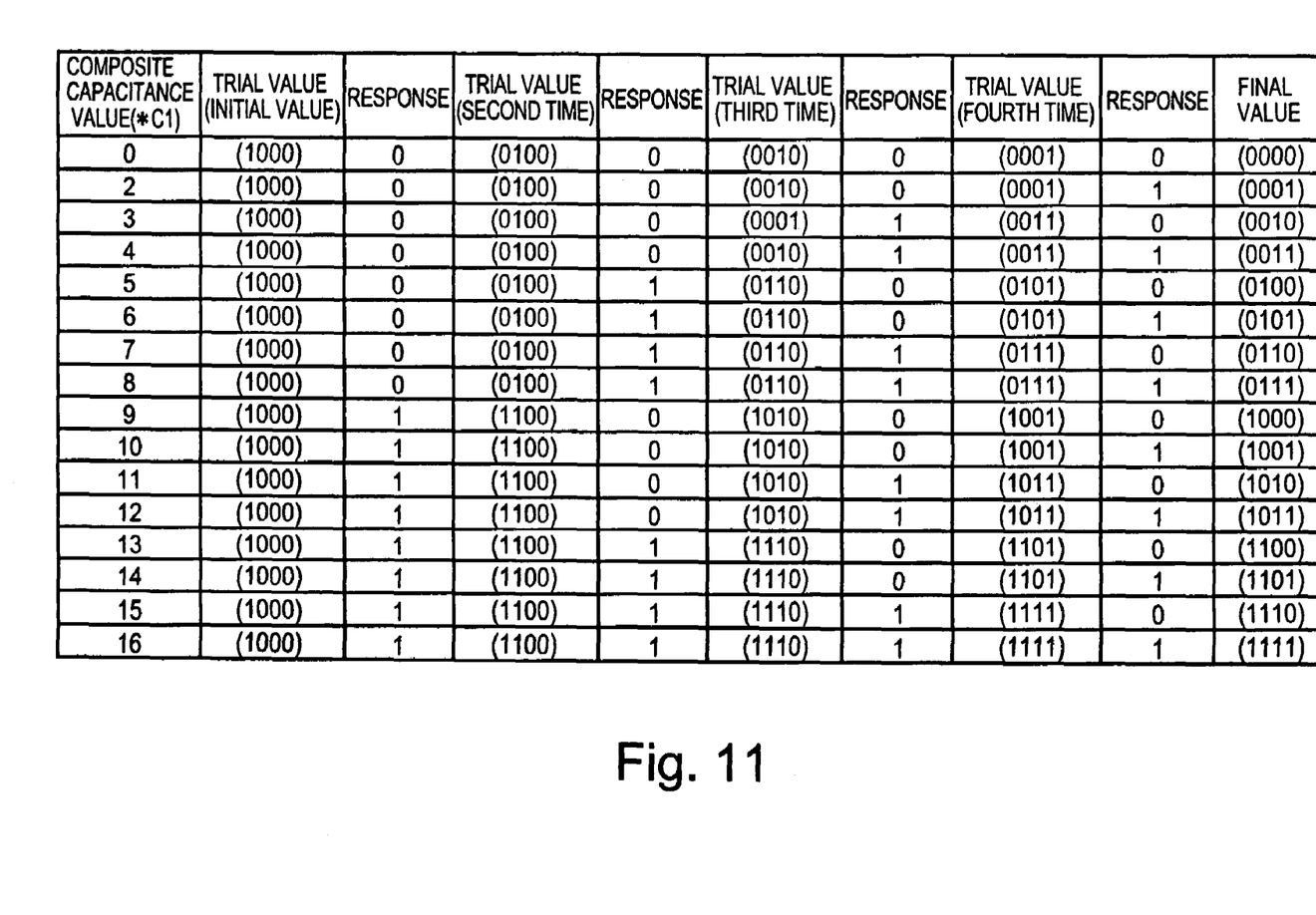
FIG. 11 shows a calculated example of device characteristic compensation data.

FIG. 11 is a diagram for describing an algorithm of a device characteristic compensating process and shows a calculated example of device characteristic compensation data strings (a, b, c, d).

In the same figure, a trial value (first time: initial value) to a trial value (fourth time) are indicative of values of data temporarily set to each device characteristic compensation data string (a, b, c, d). A response indicates the value of the monitor output. Here, "1" indicates high: power supply voltage, and "0" indicates low: 0V. The final value indicates a final determined or fixed value of a device characteristic compensation data string (a, b, c, d) obtained as a result of four trials in total. The composite capacitance value is expressed in several times the constant value C1. When the response (monitor output) is 0, the oscillation frequency band is excessively higher than a set value and reaches an oscillation frequency corresponding to set frequency data at an LPF voltage lower than a reference voltage. When the response (monitor output) is 1, the oscillation frequency band is extremely lower than the set value, and an LPF voltage higher than the reference voltage is needed. In the present embodiment, as will be described later, the calculation of the device characteristic compensation data string is executed only once upon start-up of the wireless integrated circuit.

The composite capacitance value 1*C1 corresponding to the uppermost stage in FIG. 11 will be described by way of example.

Firstly, the initial value of a device characteristic compensation data string is set to (1000) and data of a fourth-order bit is temporarily set to 1 (initial value: trial value for the first time). When the frequency pull-in is executed at this value, the monitor output becomes 0. This corresponds to a case in which the oscillation frequency band of the oscillator circuit 100 is excessively higher than the set value. Since there is a need to increase the capacitance value of the capacitor 41, corresponding to the fourth-order bit and shift the oscillation frequency to the low frequency side, data (device characteristic compensation data d) of the fourth-order bit is set to the monitor output 0, and the following third-order bit is temporarily set to 1 (trial value for the second time). On the other hand, when the monitor output is 1, the oscillation frequency band of the oscillator circuit 100 is excessively lower than the set value. Therefore, the data of the fourth-order bit is set to a monitor output 1, the capacitance value of the capacitor 41, corresponding to the fourth-order bit is reduced and the oscillation frequency is shifted to the high frequency side.

That is, the value (1 or 0) of the monitor output is set to an nth-order bit being in trial, as a determined value as it is. 1 is temporarily set to a bit to be tried next.

The response at a trial value for the second time becomes 0. In a manner similar to the above, a third-order bit is determined as 0 and a second-order bit is temporarily set to 1 (trial value for the third time).

The response at a trial value for the third time becomes 0. In a manner similar to the above, a second-order bit is determined as 0 and a first-order bit is temporarily set to 1 (trial value for the fourth time).

The response at a trial value for the fourth time becomes 0. In a manner similar to the above, a first-order bit is determined as 0 and the final value of a device characteristic compensation data string is determined as (0000). The composite capacitance value corresponding to the device characteristic compensation data string (0000) results in 1*C1.

That is, when the responses for the first to fourth times are changed to 0, 0, 0, and 0 as mentioned above, the final value of the device characteristic compensation data string is given as (0000), and the composite capacitance value of the capacitors 38 through 41 results in 1*C1. Combinations of other responses (monitor outputs) are also similar to the above. Temporary setting, frequency pull-in and determination of values for monitor outputs are repeated from an upper-order bit to a lower-order bit, so that device characteristic compensation data strings (a, b, c, d) can be determined.

According to this algorithm, device characteristic compensation data strings of n bits can be calculated by trials of n times. The composite capacitance of the device characteristic compensating capacitors can be expressed in a $2^n$ gradation. That is, many levels of gradation or gray ($2^n$) can be represented with a less number of trials n. In the present embodiment, a device characteristic compensation data string of 4 bits can be determined by the number of trials corresponding to four times. The device characteristic compensation data string can be expressed in a $2^4$ (16) gradation.

[Flowchart of Packet Transmitting/Receiving Process]

Figure 12:
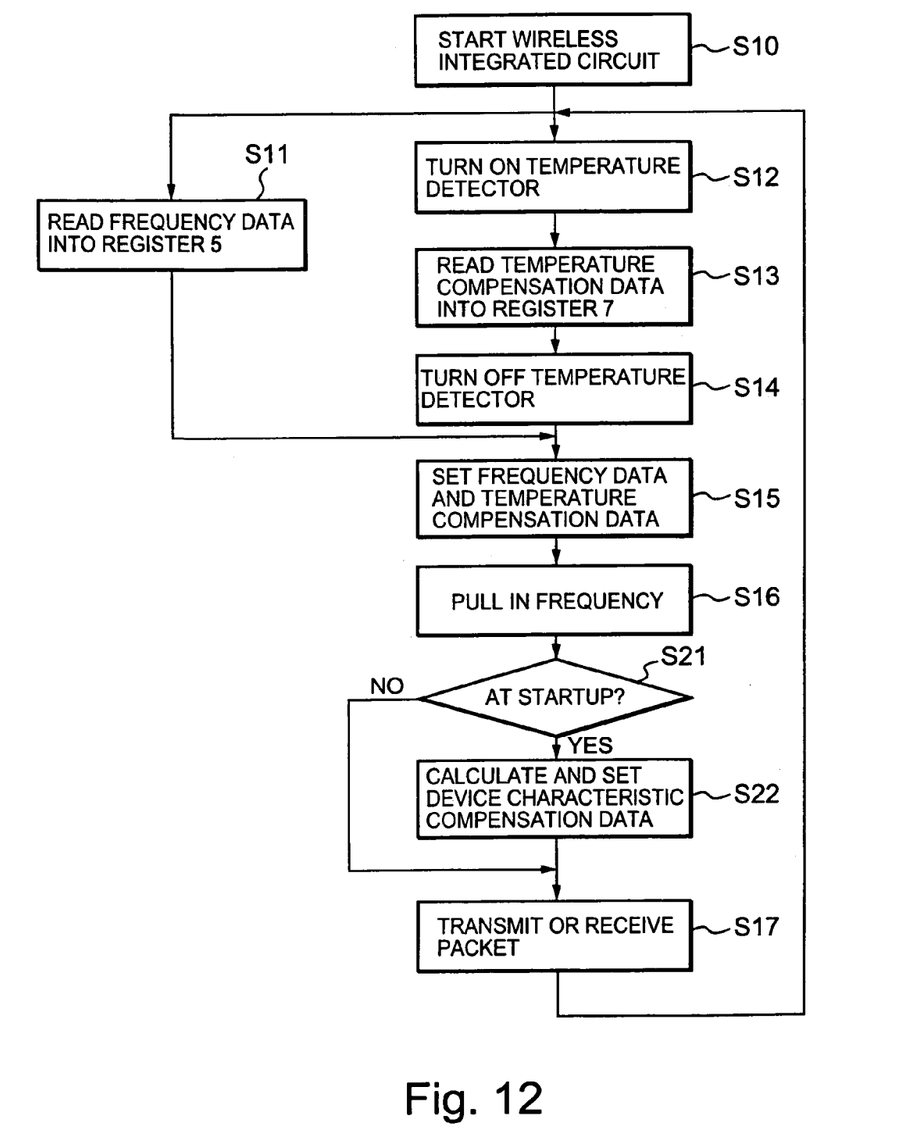
FIG. 12 is a flowchart for describing a packet transmitting/receiving process according to the second embodiment.

FIG. 12 is a flowchart for describing a packet transmitting/receiving process according to the second embodiment. In the present flowchart, Steps S21 and S22 are added to the flowchart according to the first embodiment.

In Step S21, it is discriminated whether the transmission/reception of a packet corresponding to a first time is made upon start-up of the wireless integrated circuit. If it is determined that the transmission/reception thereof has been made upon its start-up, then the process of calculating device characteristic compensation data, to be described later is executed in Step S22, and thereafter the transmission/reception of the packet (Step 17) is executed. If the answer is found to be No in Step S21, i.e., upon packet transmission/reception corresponding to a second time and later, the transmission/reception of a packet is executed in Step S17 after Step S16 in a manner similar to the first embodiment.

Figure 13:
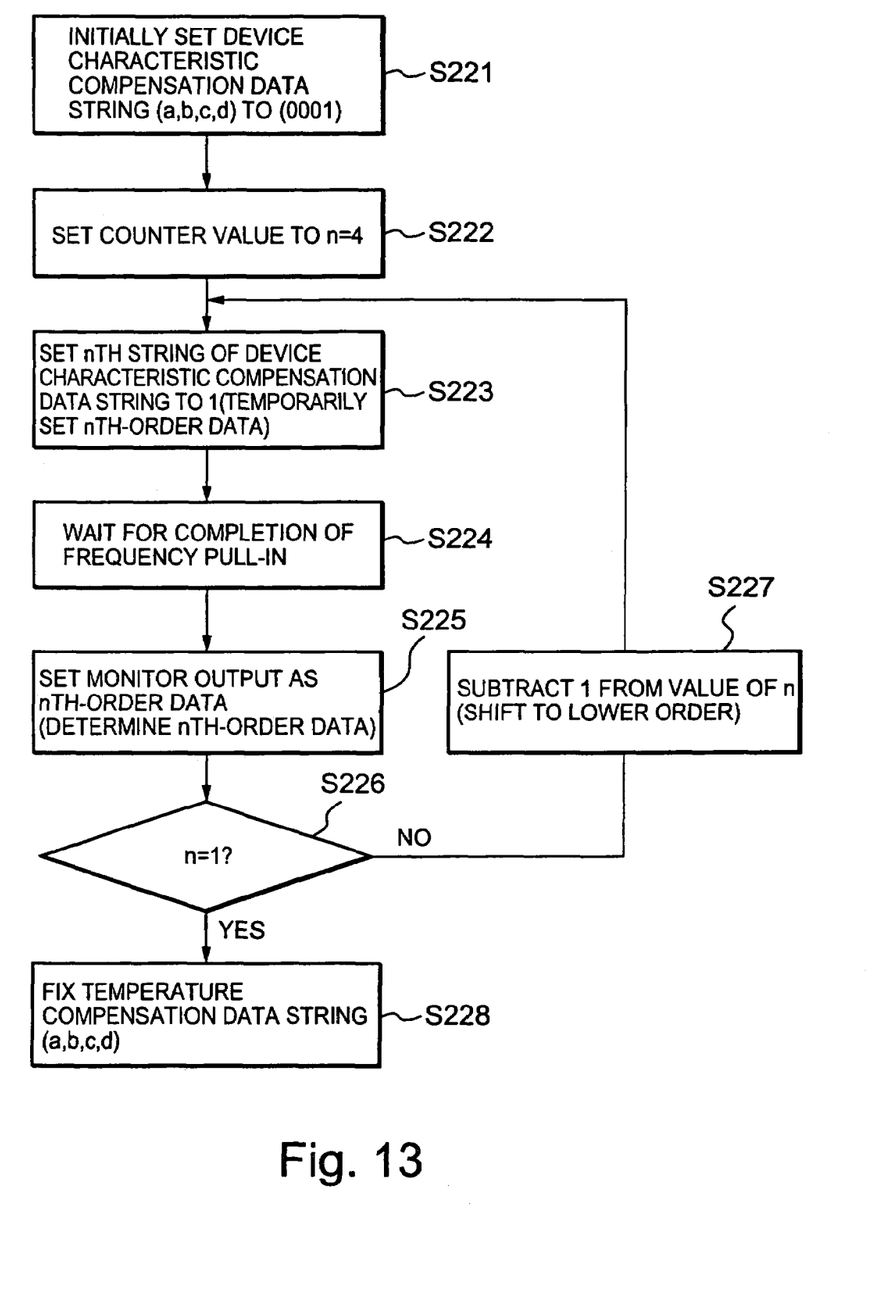
FIG. 13 is a flowchart for describing a process for calculating a string of device characteristic compensation data.

FIG. 13 is a flowchart for describing a process for calculating and setting device characteristic compensation data at Step S22.

First of all, a design voltage necessary to cause the oscillator circuit 100 to oscillate at the oscillation frequency set in Step S15 is supplied to a negative-phase input terminal of the monitor circuit 37 as a reference voltage, and device characteristic compensation data (a, b, c, d) is initially set to (0001) (Step S221). That is, the voltage applied to each of the voltage control terminals of the capacitors 38 through 41 is initially set. Next, a counter value indicative of the order of a bit to be tried is initially set to "4" corresponding to the most significant bit (Step S222).

At Step S223, 1 is set to an nth-order bit to be tried as temporary (temporary setting of nth-order data). Since, however, 1 has already been set to the fourth-order bit to be tried in Step S221 upon the first time trial (upon trial at the initial value), there is no need to set 1.

In Step S224, the phase locked loop of the oscillator circuit 100 is operated to execute frequency pull-in and waits for stability of the oscillation frequency. In the present embodiment, a waiting time is assumed to be 500 μsec.

In Step S225, the value (1 or 0) of a monitor output after the frequency pull-in is set to the nth-order bit to be tried and the value of the nth-order bit is determined.

Since the oscillation frequency is excessively lower than the design value where the monitor output is 1 as mentioned above, there is a need to reduce the capacitance value of each device characteristic compensating capacitor and shift the oscillation frequency to the high frequency side, and 1 is set to the nth-order bit. On the other hand, since the oscillation frequency might be excessively higher than the design value where the monitor output is 0, there is a need to increase the capacitance value of each device characteristic compensating capacitor and shift the oscillation frequency to the low frequency side, and 0 is set to the nth-order bit.

It is determine in Step S226 whether n=1. That is, a decision is made as to whether the determined bit is of the least significant bit. If the answer is found not to be n=1, then the present process proceeds to Step S227, where 1 is subtracted from n and the order of a bit to be tried is lowered one (e.g., it is lowered from a fourth order to a third order), and processes of Steps S223 to S225 are repeated.

When n=1 is reached at Step S226, all bits of a device characteristic compensation data string (a, b, c, d) are determined. Therefore, the device characteristic compensation data string (a, b, c, d) is fixed (Step S228) and the preset process proceeds to Step S17 of FIG. 12.

[Operation and Effects]

According to the present embodiment, since the influence of variations in device characteristic is further compensated in addition to the compensation for the influence of a change in temperature, a variation in oscillation frequency between wireless integrated circuit individuals due to the variations in device characteristic can also be compensated and an oscillation frequency band can be maintained at a design value with more satisfactory accuracy.

According to the present embodiment as well, a string of device characteristic compensation data is determined and fixed upon start-up of a wireless integrated circuit. Thereafter, temperature compensation data are further updated for each transmission/reception of a packet. Therefore, even if the temperature changes after the start-up of the wireless integrated circuit, the oscillation frequency can be maintained in the neighborhood of a design value owing to the renewal of the temperature compensation data without updating the device characteristic compensation data.

Further, according to the present embodiment, device characteristic compensation data strings (n device characteristic compensating capacitors) of n bits are prepared even if the levels of gray for a composite capacitance value necessary for device characteristic compensation need $2^n$. Thus, the values of the device characteristic compensation data strings can be determined by the number of n trials. Accordingly, the number of trials may be n times to determine the levels of gray equivalent to $2^n$, and an increase in time required to determine the corresponding device characteristic compensation data-string is suppressed and hence the levels of gray can be increased.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An oscillator circuit comprising:
a resonant circuit including a negative resistor, an inductor and an oscillation frequency setting capacitor having a variable capacitance according to a control voltage based on oscillation frequency data and outputting a signal having an oscillation frequency based on the oscillation frequency data;
a temperature detector detecting temperature and generating temperature compensation data based on the detected temperature; and
a temperature compensating capacitor which as electrically connected to the resonant circuit and changed in capacitance value based on the temperature compensation data so as to adjust the oscillation frequency; and
a temperature compensation data setting unit which is connected to the temperature detector and which obtains and retains the temperature compensation data for each packet and supplies the same to the temperature compensation capacitors,
wherein said oscillator circuit is mounted to a wireless apparatus that transmits and receives a packet.

2. An oscillation circuit according to claim 1, wherein the negative resistor comprises a plurality of transistors.

3. An oscillation circuit according to claim 2, wherein the plurality of transistors included in the negative resistor constitute a positive feedback loop.

4. An oscillation circuit according to claim 1, wherein the oscillator circuit is included in a wireless integrated circuit mounted in a wireless apparatus.

5. An oscillator circuit comprising:
a monitor circuit for monitoring a low pass filter voltage, the monitor circuit having a reference voltage input, an input for receiving a low pass filter signal and a monitor output;
a voltage-controlled oscillator having a negative resistor, an inductor connected in parallel with the negative resistor, a first oscillation frequency setting capacitor connected in parallel with the negative resistor, the first oscillation frequency setting capacitor having a variable capacitance that is changed in response to a temperature compensation signal received thereto, and a plurality of device characteristic compensation data capacitors connected in parallel with the negative resistor; and
a buffer circuit connected to the negative resistor for outputting a frequency division signal.

6. The oscillator circuit of claim 5, wherein each of the plurality of device characteristic compensation data capacitors has variable capacitance for adjusting a shift in oscillation frequency band due to variations in device characteristic of the oscillator circuit.

7. The oscillator circuit of claim 6, wherein the plurality of device characteristic compensation data capacitors are set so as to select the capacitors in which the dependence of the capacitance values on a voltage becomes substantially zero between 0 V and a power supply voltage.

8. The oscillator circuit of claim 6, wherein the plurality of device characteristic compensation data capacitors are connected in parallel and each successive capacitor of the plurality of device characteristic compensation data capacitors has a capacitance value proportional in the power of 2.

9. The oscillator circuit of claim 6 further comprising a device characteristic compensation circuit for controlling a string of device characteristic data by providing input signals to the plurality of device characteristic compensating capacitors based on the monitor output and for adjusting the capacitance values of the plurality of device characteristic compensating capacitors.

10. The oscillator circuit of claim 6 further comprising a phase comparator for receiving a reference frequency signal and a frequency division signal and generating a comparison signal based on a phase difference between the reference frequency signal and the frequency division signal;
   a loop filter connected to the phase comparator for smoothing the comparison signal; and a second oscillation frequency setting capacitor connected in parallel with the negative resistor, wherein the second oscillation frequency setting capacitor has a variable capacitance that is changed in response the smoothed comparison signal received from the loop filter, and wherein the phase comparator and the loop filter are connected to the voltage-controlled oscillator for generating the frequency division signal.

\* \* \* \* \*